(12) United States Patent
Kwon et al.

(10) Patent No.: US 7,767,489 B2
(45) Date of Patent: Aug. 3, 2010

(54) DONOR SUBSTRATE FOR A FLAT PANEL DISPLAY AND METHOD OF FABRICATING AN ORGANIC LIGHT EMITTING DIODE (OLED) DISPLAY USING THE SAME

(75) Inventors: Young-Gil Kwon, Suwon-si (KR); Sun-Hee Lee, Suwon-si (KR); Jae-Ho Lee, Suwon-si (KR); Mu-Hyun Kim, Suwon-si (KR); Seong-Taek Lee, Suwon-si (KR); Nam-Choul Yang, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 355 days.

(21) Appl. No.: 11/797,402

(22) Filed: May 3, 2007

(65) Prior Publication Data

US 2007/0257276 A1 Nov. 8, 2007

(30) Foreign Application Priority Data

May 3, 2006 (KR) ............... 10-2006-0040152

(51) Int. Cl.
*H01L 51/40* (2006.01)
*H01L 23/58* (2006.01)
*H01L 35/24* (2006.01)

(52) U.S. Cl. ............... 438/99; 257/40; 257/642
(58) Field of Classification Search .......... 428/332, 428/447, 690; 430/199; 438/82, 99; 257/40, 257/642, E51.001–E51.052
See application file for complete search history.

(56) References Cited

U.S. PATENT DOCUMENTS

| 5,998,085 | A | 12/1999 | Isberg et al. |
| 6,114,088 | A | 9/2000 | Wolk et al. |
| 6,214,520 | B1 | 4/2001 | Wolk et al. |
| 6,242,152 | B1 | 6/2001 | Staral et al. |
| 6,699,597 | B2 | 3/2004 | Bellmann et al. |
| 6,870,198 | B2 | 3/2005 | Kim et al. |
| 7,052,784 | B2 | 5/2006 | Chin et al. |
| 7,161,294 | B2 | 1/2007 | Chin et al. |
| 7,332,739 | B2 | 2/2008 | Kim et al. |
| 7,361,416 | B2 | 4/2008 | Kim et al. |
| 7,474,048 | B2 * | 1/2009 | Forrest et al. ............... 313/504 |
| 2005/0123850 | A1 * | 6/2005 | Wolk ........................... 430/199 |

FOREIGN PATENT DOCUMENTS

| CN | 1 592 524 A | 3/2005 |
| CN | 1 747 611 A | 3/2006 |
| JP | 2003-531756 Y | 10/2003 |
| JP | 2005-079087 A | 3/2005 |

(Continued)

*Primary Examiner*—Calvin Lee
(74) *Attorney, Agent, or Firm*—Lee & Morse, P.C.

(57) ABSTRACT

A donor substrate for a flat panel display includes a base film, a light-to-heat conversion layer on the base film, a first buffer layer on the light-to-heat conversion layer, the first buffer layer including an emission host material, a transfer layer on the first buffer layer, and a second buffer layer on the transfer layer, the second buffer layer including an emission host material identical to the emission host material of the first buffer layer.

20 Claims, 1 Drawing Sheet

FOREIGN PATENT DOCUMENTS

| | | |
|---|---|---|
| JP | 2005-310399 A | 11/2005 |
| KR | 10-2003-0097363 A | 12/2003 |
| KR | 10-2004-0001381 A | 1/2004 |
| KR | 10-2005-0024763 A | 3/2005 |
| KR | 10-2006-0023056 A | 3/2006 |

* cited by examiner

DONOR SUBSTRATE FOR A FLAT PANEL DISPLAY AND METHOD OF FABRICATING AN ORGANIC LIGHT EMITTING DIODE (OLED) DISPLAY USING THE SAME

BACKGROUND OF THE INVENTION

1. Field of the Invention

The present invention relates to a donor substrate for a flat panel display and a method of fabricating an organic light emitting diode display using the same. More particularly, the present invention relates to a donor substrate having a structure capable of preventing or minimizing device substrate patterning defects due to unsuccessful layer transfer.

2. Description of the Related Art

Generally, an organic light emitting diode (OLED) display refers to a flat panel display having an anode electrode, a cathode electrode, and a plurality of organic layers interposed between the anode and cathode electrodes. The organic layers may include an emission layer, a hole injection layer, a hole transport layer, an electron transport layer, and an electron injection layer. The material employed in the emission layer may determine the type of the OLED display, i.e., a polymer OLED display or a low molecular weight OLED display. The processing of the emission layer may determine the functionality of the OLED display, e.g., patterning of the emission layer may facilitate implementation of a full-color organic light emitting diode display.

Conventional patterning of the OLED display may be done by a fine metal mask, ink-jet printing, laser induced thermal imaging ("LITI"), and so forth. The LITI method, for example, may facilitate fine patterning of the OLED display and provide dry processing thereof, as opposed to wet processing, e.g., ink-jet printing. The conventional LITI method for forming a patterned emission layer of an OLED display may require forming a donor substrate having a base film, a light-to-heat conversion layer, and a transfer layer formed of an organic material, so that the transfer layer may be transferred from the donor substrate into a device substrate by using at least one light source, e.g., a laser.

More specifically, light may be emitted from the light source into a predetermined portion of the light-to-heat conversion layer of the donor substrate and converted therein into heat energy. Next, the heat energy may modify an adhesive in the predetermined portion of the light-to-heat conversion layer, i.e., a portion radiated with the light source, so that the transfer layer may separate from the predetermined portion of the light-to-heat conversion layer and attach to the device substrate. Accordingly, one portion of the transfer layer may be attached to the device substrate, while another portion of the transfer layer may remain attached to the light-to-heat conversion layer. Therefore, a successful transfer of the transfer layer may depend on adhesion and cohesion properties of the materials employed, e.g., adhesion between the light-to-heat conversion layer of the donor substrate and the transfer layer, cohesion within the transfer layer, and adhesion between the transfer layer and the device substrate.

For example, if the adhesion between the light-to-heat conversion layer and the transfer layer is weak, the transfer layer may too easily separate from the light-to-heat conversion layer, i.e., a portion of the transfer layer intended to remain attached to the light-to-heat conversion layer may separate therefrom as well and, thereby, cause defects in the OLED display. The defect occurs more often, especially when the transfer layer is formed of low molecular weight materials exhibiting insufficient internal cohesion. On the other hand, if the adhesion between the transfer layer and the device substrate is too strong, the transfer layer may not be transferred or be torn during transfer.

Accordingly, there exists a need for a donor substrate capable of transferring a transfer layer onto a device substrate with an improved efficiency.

SUMMARY OF THE INVENTION

The present invention is therefore directed to a donor substrate and a method of fabricating an OLED display employing the same, which substantially overcome one or more of the disadvantages of the related art.

It is therefore a feature of the present invention to provide a donor substrate for a flat panel display capable of preventing or substantially minimizing defective transfer of a transfer layer to a device substrate.

It is another feature of an embodiment of the present invention to provide a method of fabricating an OLED display by employing a donor substrate capable of preventing or substantially minimizing defective transfer of a transfer layer to a device substrate by LITI.

At least one of the above and other features and advantages of the present invention may be realized by providing a donor substrate for a flat panel display, including a base film, a light-to-heat conversion (LTHC) layer on the base film, a first buffer layer on the LTHC layer and including an emission host material, a transfer layer on the first buffer layer, and a second buffer layer on the transfer layer and including an emission host material identical to the emission host material of the first buffer layer. The donor substrate may further include an interlayer between the LTHC layer and the first buffer layer.

The first buffer layer may include CBP, CBP derivatives, mCP, mCP derivatives, or spiro-based derivatives. The first buffer layer may include a phosphorescent host material. The first buffer layer may have a thickness of about 1 nm to about 3 nm.

The transfer layer may include at least one of an emission layer, a hole injection layer, a hole transport layer, an electron injection layer, an electron transport layer, a hole blocking layer, and an electron blocking layer. The transfer layer may include at least one layer having a low molecular weight material. The transfer layer may include an emission host material and a dopant, and the emission host material may be identical to the emission host material of the first buffer and the second buffer layer.

The second buffer layer may include CBP, CBP derivatives, mCP, mCP derivatives, or spiro-based derivatives. The second buffer layer may include a phosphorescent host material. The second buffer layer may have a thickness of about 1 nm to about 3 nm.

In another aspect of the present invention, there is provided a method of fabricating an organic light-emitting diode display, including providing a device substrate with a lower electrode, sequentially depositing a base film, a light-to-heat conversion layer, a first buffer layer including an emission host material, a transfer layer, and a second buffer layer including an emission host material identical to the emission host material of the first buffer layer to form a donor substrate, disposing the donor substrate over the device substrate, so that the second buffer layer is directly across from the device substrate, and radiating a laser onto a predetermined region of the donor substrate to transfer portions of the first buffer layer, the transfer layer, and the second buffer layer onto the lower electrode to form an organic layer pattern.

The transfer layer may include at least one organic layer of an emission layer, a hole injection layer, a hole transport layer, an electron injection layer, an electron transport layer, a hole blocking layer, and an electron blocking layer. The transfer layer may include a low molecular weight material. The transfer layer may include an emission host material and a dopant, and the emission host material may be identical to the emission host material of the first buffer layer and the second buffer layer.

Depositing the first buffer layer may include spin coating, roll coating, dip coating, gravure coating, or deposition. Similarly, depositing the second buffer layer may include spin coating, roll coating, dip coating, gravure coating, or deposition. Depositing the first buffer layer, transfer layer, and second buffer layer may include depositing an identical emission host material.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
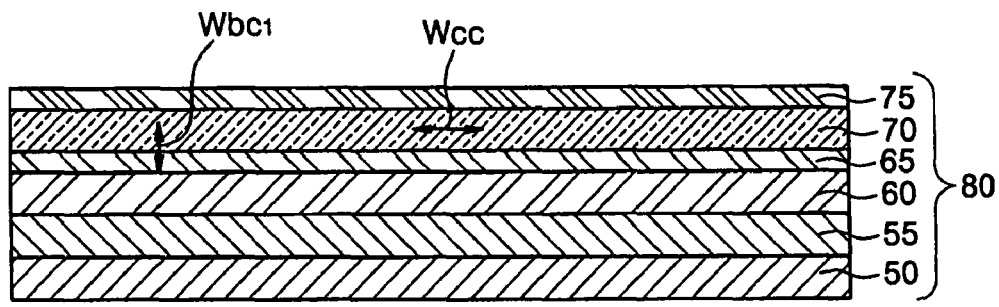
FIG. 1 illustrates a cross-sectional view of a donor substrate for a flat panel display according to an exemplary embodiment of the present invention.

Korean Patent Application No. 10-2006-0040152, filed on May 3, 2006, in the Korean Intellectual Property Office, and entitled: "Donor Substrate for Flat Panel Display and Method of Fabricating OLED Using the Same," is incorporated by reference herein in its entirety.

The present invention will now be described more fully hereinafter with reference to the accompanying drawings, in which exemplary embodiments of the invention are illustrated. This invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or a substrate, it can be directly on the other layer or substrate, or intervening layers may also be present. Further, it will be understood that when a layer is referred to as being "under" another layer, it can be directly under, or one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, an exemplary embodiment of a donor substrate for a flat panel display and a method of fabrication thereof in accordance with the present invention will be described in more detail below with reference to FIG. 1. As illustrated in FIG. 1, a donor substrate 80 may include a base film 50, a light-to-heat conversion (LTHC) layer 55, an inter layer 60, a first buffer layer 65, a transfer layer 70, and a second buffer layer 75.

The base film 50 may be formed of a transparent polymer material, such as polyester, e.g., polyethylene terephthalate (PET), polyacryl, polyepoxy, polyethylene, polystyrene, and so forth, to a thickness of about 10 μm to about 500 μm. The base film 50 may be provided as a support film of the donor substrate 80, so that a plurality of additional layers may be applied to the base film 50. Accordingly, the base film 50 may exhibit sufficient optical properties, e.g., transparency and high transmission of light at a predetermined wavelength, as well as mechanical and thermal stability to provide substantial support.

The LTHC layer 55 of the donor film 80 may be deposited on the base film 50 to absorb light in an infrared-visible region and convert a portion thereof into heat. The LTHC layer 55 may include an optical absorption material exhibiting optical density in the infrared-visible region. For example, the optical absorption material may include dyes, e.g., an infrared dye, pigments, e.g., carbon black and graphite, metals, e.g., aluminum, metal compounds, e.g., aluminum oxide and aluminum sulfide, polymers, and a combination thereof. One example of a suitable LTHC layer 55 may include a metal film with an organic polymer film. The metal film may be deposited by vacuum deposition, electron beam deposition, or sputtering to a thickness of about 100 angstroms to about 5000 angstroms. The polymer film may be deposited by a film coating method, e.g., roll coating, gravure, extrusion, spin coating, knife coating, and so forth, to a thickness of about 0.1 μm to about 10 μm.

The interlayer 60 of the donor film 80 may be formed on the LTHC layer 55 of acrylic resin or alkyd resin. The interlayer 60 may be formed between the LTHC layer 55 and the transfer layer 70 in order to minimize contamination of the transfer layer 70. The interlayer 60 may be formed by a coating process, e.g., solvent coating, ultraviolet light curing process, and so forth.

The transfer layer 70 of the donor substrate 80 may be formed on the LTHC layer 55. The transfer layer 70 may have a single layer structure or a multi-layer structure including at least one of an emission layer, a hole injection layer, a hole transport layer, an electron injection layer, an electron transport layer, a hole blocking layer, an electron blocking layer, and so forth. The transfer layer 70 may be formed of any suitable organic material, e.g., low molecular weight organic material, as determined by one of ordinary skill in the art.

More specifically, the emission layer of the transfer layer 70 may include a specific combination of an emission host material with a dopant formed of a low molecular weight material, or a polymer to provide a predetermined luminescent color. For example, a combination of an emission host material, e.g., tris-(8-hydroxyquinoline)aluminum (Alq3); 4,4'-N,N'-dicarbazolebiphenyl (CBP), and so forth, with a dopant, e.g., 4-(dicyanomethylene)-2-t-butyl-6-(1,1,7,7-tetramethyljulolidyl-9-enyl)-4H-pyran (DCJTB), 4-(dicyanomethylene)-2-methyl-6-(dimethylaminostyryl)-4H-pyran (DCM), platinum octaethylporphyrin (PtOEP), and so forth, or a polymer, e.g., polyfluorene (PFO) based polymer, polyphenylene-vinylene (PPV) based polymer, and so forth, may provide a red luminescent material. A combination of an emission host material, e.g., Alq3, CBP, and so forth, with a dopant, e.g., 10-(2-benzothiazolyl)-2,3,6,7-tetrahydro-1,1,7,7-tetramethyl-1H,5H,11H-(1)-benzopyropyrano(6,7-8-i,j) quinolizin-11-one (C545t), tris(2-phenylpirydine)iridium (IrPPy), and so forth, or a polymer, e.g., PFO-based polymer, PPV-based polymer, and so forth, may provide a green luminescent material. A low molecular weight material, e.g., 4,4'-bis-(2,2-diphenyl vinyl)-1,1'-biphenyl (DPVBi), spiro-DPVBi, spiro-6P, distyryl benzene (DSB), distyryl arylene (DSA), and so forth, and a polymer, e.g., PFO-based polymer, PPV-based polymer, and so forth, may provide a blue luminescent material. Preferably, the emission host material of the emission layer is identical to the emission host material of a first buffer layer and a second buffer layer referring later, because in that case the emission layer may be able to have better adhesion to the first buffer layer and the second buffer layer.

The hole injection layer of the transfer layer 70 may be formed of a low molecular weight material, e.g., copper phthalocyanine (CuPc); 4,4',4"tris(N-(1-naphthyl)-N-phenyl-amino)-triphenylamine (1-TNATA); 4,4',4"-tris(N-carbazolyl)triphenylamine (TCTA); 1,3,5-tris(N,N-bis-(4,5-methoxyphenyl)-aminophenyl)benzol (TDAPB); and so forth, or a polymer, e.g., polyaniline (PANI); polyethylenedioxythiophene (PEDOT); and so forth. The hole transport layer of the transfer layer 70 may be formed of a low molecular weight material, such as arylamine-based low molecule, hydrazone-based low molecule, stilbene-based low molecule, starburst-based low molecule, e.g., N,N'-diphenyl-N,N'-bis(1-naphthyl)-1,1'-biphenyl-4,4'-diamine (NPB); N,N'-bis(3-methylphenyl)-N,N'-bis(phenyl)-benzidine (TPD); s-TAD; 4,4',4"-tris(N-3-methylphenyl-N-phenylamino)-triphenylamine (MTADATA); or the like, or a polymer, such as carbazole-based polymer, arylamine-based polymer, perylene-based polymer, pyrrole-based polymer, e.g., (poly (9-vinylcarbazole) (PVK), and so forth. The electron transport layer of the transfer layer 70 may be formed of a polymer, e.g., polybutadiene (PBD), 1,2,4-triazole (TAZ) derivative, or spiro-PBD, or a low molecular weight material, e.g., Alq3, aluminum(III)bis(2-methyl-8-hydroxyquinolinato)4-phenylphenolate (BAlq); or bis-(2 methyl-8-quinolinolato) (triphenylsiloxy)aluminum(III) (SAlq). The electron injection layer of the transfer layer 70 may be formed of a low molecular weight material, e.g., Alq3, Ga complex, or PBD, or a polymer, e.g., oxadiazole-based polymer. The hole blocking layer of the transfer layer 70 may be formed of PBD, spiro-PBD, or TAZ. The electron blocking layer of the transfer layer 70 may be formed of BAlq, BCP, TAZ, or spiro-TAZ.

The transfer layer 70 may be formed to a thickness of about 100 angstroms to about 50,000 angstroms by any suitable coating method as determined by one of ordinary skill in the art, e.g., extrusion, spin coating, knife coating, vacuum deposition, CVD, and so forth.

The first buffer layer 65 may be formed between the LTHC layer 55 and the transfer layer 70 to impart adhesive properties between the transfer layer 70 and the LTHC layer 55 in order to facilitate transfer thereof onto a device substrate, as will be discussed in more detail below with respect to FIG. 2. If the interlayer 60 is formed on the LTHC layer 55, the interlayer 60 may be positioned between the first buffer layer 65 and the LTHC layer 55. The first buffer layer 65 may absorb any potential vibrations radiated from the device substrate to reduce patterning defects during the transfer process. Further, since some of the low molecular weight materials may have low thermal stability, the buffer layer 65 may control heat generated in the LTHC layer 55 during the transfer process and, thereby, minimize thermal damage of the transfer layer 70.

The first buffer layer 65 may be formed of an emission host material. The emission host material has a sufficient adhesion property to the LTHC layer 55, capable of being transferred without defective, such as unintended portions being stuck on a device substrate of intended portions being torn. The first buffer layer 65 may include arylamine-based material, carbazole-based material, spiro-based material, and so forth. More specifically, the first buffer layer 65 may include a phosphorescent host material having more sufficient adhesion property to the LTHC layer 55, e.g., CBP, CBP derivatives, N,N-dicarbazolyl-3,5-benzene (mCP), mCP derivatives, spiro-based derivatives, or TMM004 (Covion). Accordingly, a sufficient adhesion may be imparted between the first buffer layer 65 and the LTHC layer 55 to balance the adhesion Wbc1 between the LTHC layer 55 and the transfer layer 70.

The adhesion Wbc1 may be sufficient to attach the transfer layer 70 and the LTHC layer 55. When the adhesion Wbc1 is too high, the transfer layer 70 may be torn during transfer. On the other hand, when the adhesion Wbc1 is too low, the transfer layer 70 may be completely removed from the donor substrate 80 during transfer thereof onto the device substrate, thereby generating a patterning defect due to excessive amount of organic material portions on the device substrate.

The first buffer layer 65 may be formed to a thickness of about 1 nm to about 3 nm by spin coating, roll coating, dip coating, gravure coating, deposition, or any other method as may be determined by one of ordinary skill in the art. When the first buffer layer 65 is formed to a thickness of less than about 1 nm, the adhesion Wbc1 may not be sufficiently high to bind the transfer layer 70 and LTHC layer 55. When the first buffer layer 65 is formed to a thickness greater than about 3 nm, an excessive amount of characteristics of the material forming the first buffer layer 65 may be imparted onto the transfer layer 70, thereby increasing a required drive voltage of the OLED display and accelerating deterioration of the OLED display.

The second buffer layer 75 of the substrate donor 80 may be formed on the transfer layer 70, so that the transfer layer 70 may be disposed between the first and second buffer layers 65 and 75. In addition, the second buffer layer 75 may absorb any potential vibrations radiated from the device substrate to reduce patterning defects during the transfer process.

The second buffer layer 75 may be formed of the same material as the first buffer layer 65 to improve an adhesion Wbc2 between the transfer layer 70 and the device substrate. When the adhesion Wbc2 is too strong, the transfer layer 70 may be torn by the device substrate during transfer onto the device substrate. On the other hand, when the adhesion Wbc2 is too weak, the transfer layer 70 may not properly attach to the device substrate and, thereby, cause a patterning defect. The second buffer layer 75 may be formed of an emission host material. The emission host material has a sufficient adhesion property to the device substrate, capable of being transferred without defective, such as unintended portions being stuck on a device substrate or intended portions being torn. The material for the second buffer layer 75 may include an arylamine-based material, a carbazole-based material, and/or a spiro-based material. More specifically, the second buffer layer 75 may include a phosphorescent host material having more sufficient adhesion property to the device substrate, e.g., CBP, CBP derivatives, mCP, mCP derivatives, spiro-based derivatives, or TMM004 (Covion). Further, the second buffer layer 75 may be formed to a thickness of about 1 nm to about 3 nm by spin coating, roll coating, dip coating, gravure coating, deposition, or the like. When the second buffer layer 75 is formed to a thickness of less than about 1 nm, the adhesion Wbc2 may not be sufficiently improved. When the second buffer layer 75 is formed to a thickness greater than about 3 nm, characteristics of the material forming the second buffer layer 75 may be imparted onto the transfer layer 70, thereby increasing a drive voltage and deteriorating properties of the OLED display.

Without intending to be bound by theory, it is believed that formation of the first buffer layer 65 between the LTHC layer 55 and the transfer layer 70 may improve the adhesion Wbc1 therebetween. More specifically, it may be more helpful in case the transfer layer 70 includes a low molecular weight material having a low inner molecular cohesion Wcc thereby providing a layer potentially susceptible to tearing and/or difficult transfer control. When the first buffer layer 65 is deposited in communication with the transfer layer 70, the transfer characteristics of the transfer layer 70 is determined by the adhesion between the first buffer 65 and the LTHC layer 55. As such, controlled transfer of the transfer layer 70, e.g., transfer of predetermined portions thereof, may be facilitated. Similarly, when the second buffer layer 75 is deposited, i.e., formation of the transfer layer 70 between first and second buffer layers 65 and 75, transfer characteristics of the transfer layer 70 is determined by the adhesion property between the second buffer layer 75 and the device substrate 100. As such, transfer characteristics of the transfer layer 70 onto the device substrate 100 may be improved even further.

According to another exemplary embodiment of the present invention, a method of fabricating an OLED display will be described in detail below with respect to FIG. 2. As illustrated in FIG. 2, a device substrate 100 having a lower electrode 110 may be provided. As further illustrated in FIG. 2, a LTHC layer 55, an interlayer 60, a first buffer layer 65, a transfer layer 70, and a second buffer layer 75 may be sequentially deposited on a base film 50 to form a donor substrate 80. The donor substrate 80 and its components were previously described with respect to FIG. 1, and therefore, their description will not be repeated herein.

Figure 2:
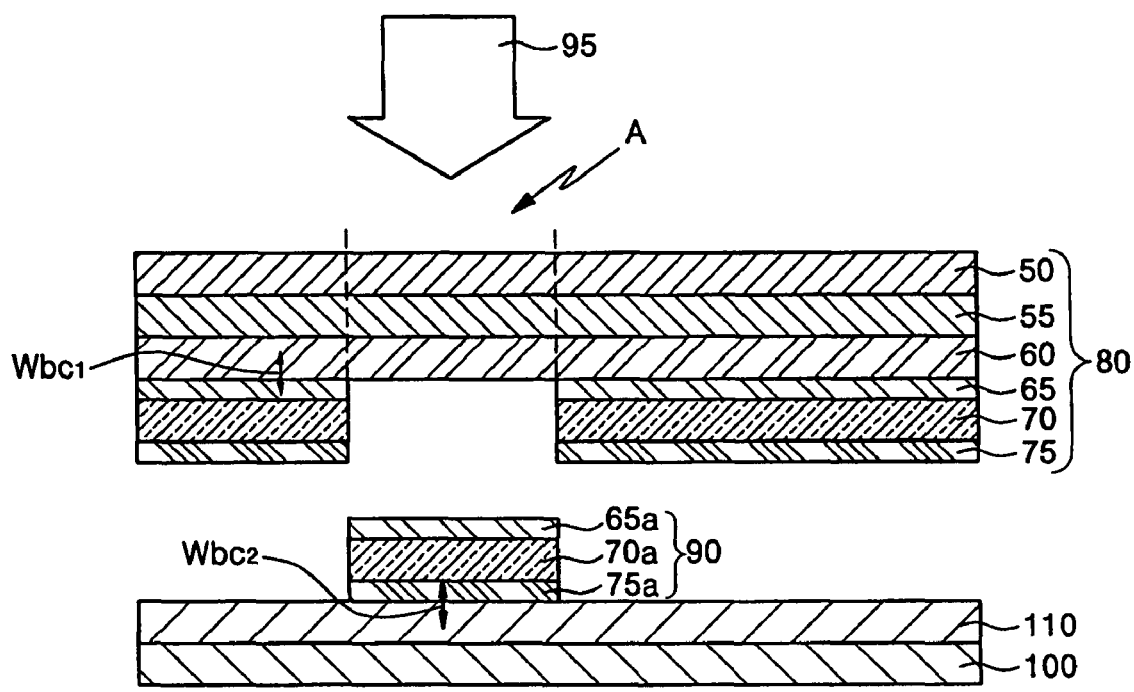
FIG. 2 illustrates a cross-sectional view of a method of fabricating an OLED display according to an exemplary embodiment of the present invention.

Next, the donor substrate 80 may be disposed over the device substrate 100 with a predetermined gap therebetween, so that the second buffer layer 75 is directly across from the device substrate 100, as illustrated in FIG. 2. Subsequently, a laser beam 95 may be radiated onto a predetermined region A of the donor substrate 80 to modify adhesion between the first buffer layer 65 and the LTHC layer 55. As a result, portions of the first buffer layer 65, transfer layer 70, and second buffer layer 75 corresponding to the predetermined region A of the donor substrate 80 may be separated from the donor substrate 80 and transferred onto the lower electrode 110. The transferred portions of the first buffer layer 65, transfer layer 70, and second buffer layer 75 may form an organic layer pattern 90 having a first buffer layer 65a, a transfer layer 70a, and a second buffer layer 75a on the lower electrode 110, as further illustrated in FIG. 2. The transfer layer 70a of the organic layer pattern 90 may be a single layer or a multi-layer formed of a plurality of organic layers, e.g., an emission layer, a hole injection layer, a hole transport layer, an electron transport layer, an electron injection layer, and so forth.

The lower electrode 110 may be an anode electrode, and the organic layer pattern 90, e.g., an emission layer, may be formed on the lower electrode 110 by using the donor substrate 80. Prior to forming the organic layer pattern 90 on the lower electrode 110, additional layers may be formed directly on the lower electrode 110. For example, a hole injection layer and/or a hole transport layer may be formed on the lower electrode 110 by spin coating or vacuum deposition, followed by formation of the organic layer pattern 90, e.g., an emission layer, thereon. Similarly, additional layers may be formed directly on the layer pattern 90. For example, an electron transport layer and/or an electron injection layer may be formed on the organic layer pattern 90, e.g., emission layer, by LITI, vacuum deposition or spin coating. Next, an upper electrode (not shown) as a cathode electrode may be formed on the electron transport layer and/or the electron injection layer to complete fabrication of the OLED display.

A method of fabricating a donor substrate for a flat panel display according to an embodiment of the present invention may be advantageous in providing an improved adhesion between the transfer layer and the donor substrate and between the transfer layer and the device substrate by forming the transfer layer in the donor substrate between first and second buffer layers. As such, the transfer layer may be transferred onto the device substrate, while preventing or substantially minimizing patterning defects in the device substrate.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating an organic light-emitting diode display, comprising:
   providing a device substrate with a lower electrode;
   sequentially depositing a base film, a light-to-heat conversion layer, a first buffer layer, a transfer layer, and a second buffer layer to form a donor substrate, the first and second buffer layers including an identical emission host material, and the transfer layer including the emission host material of the first and second buffer layers and a dopant;
   disposing the donor substrate over the device substrate, so that the second buffer layer is directly across from the device substrate; and
   radiating a laser onto a predetermined region of the donor substrate to transfer portions of the first buffer layer, the transfer layer, and the second buffer layer onto the lower electrode to form an organic layer pattern.

2. The method as claimed in claim 1, wherein depositing the transfer layer includes depositing at least one organic layer of an emission layer, a hole injection layer, a hole transport layer, an electron injection layer, an electron transport layer, a hole blocking layer, and an electron blocking layer.

3. The method as claimed in claim 2, wherein depositing the transfer layer includes depositing a low molecular weight material.

4. The method as claimed in claim 1, wherein depositing the first buffer layer includes depositing by spin coating, roll coating, dip coating, gravure coating, or deposition.

5. The method as claimed in claim 1, wherein depositing the second buffer layer includes depositing by spin coating, roll coating, dip coating, gravure coating, or deposition.

6. The method as claimed in claim 1, wherein radiating a laser onto a predetermined region of the donor substrate includes modifying adhesion between the first buffer layer and the light-to-heat conversion layer.

7. A donor substrate for a flat panel display, comprising:
   a base film;
   a light-to-heat conversion layer on the base film;
   a first buffer layer on the light-to-heat conversion layer, the first buffer layer including an emission host material;
   a transfer layer on the first buffer layer, the transfer layer including the emission host material of the first buffer layer and a dopant; and
   a second buffer layer on the transfer layer, the second buffer layer including an emission host material identical to the emission host material of the first buffer layer.

8. The donor substrate as claimed in claim 7, wherein the first buffer layer includes CBP, CBP derivatives, mCP, mCP derivatives, or spiro-based derivatives.

9. The donor substrate as claimed in claim 7, wherein the first buffer layer includes a phosphorescent host material.

10. The donor substrate as claimed in claim 7, wherein the first buffer layer has a thickness of about 1 nm to about 3 nm.

11. The donor substrate as claimed in claim 7, wherein the transfer layer includes at least one of an emission layer, a hole injection layer, a hole transport layer, an electron injection layer, an electron transport layer, a hole blocking layer, and an electron blocking layer.

12. The donor substrate as claimed in claim 11, wherein the transfer layer includes at least one layer having a low molecular weight material.

13. The donor substrate as claimed in claim 7, further comprising an interlayer between the light-to-heat conversion layer and the first buffer layer.

14. The donor substrate as claimed in claim 7, wherein the second buffer layer includes CBP, CBP derivatives, mCP, mCP derivatives, or spiro-based derivatives.

15. The donor substrate as claimed in claim 7, wherein the second buffer layer includes a phosphorescent host material.

16. The donor substrate as claimed in claim 7, wherein the second buffer layer has a thickness of about 1 nm to about 3 nm.

17. The donor substrate as claimed in claim 7, wherein the transfer layer is between the first and second buffers layers.

18. The donor substrate as claimed in claim 7, wherein the transfer layer is a low molecular weight material.

19. The donor substrate as claimed in claim 7, wherein the transfer layer includes an emission layer, the emission layer including the emission host material of the first buffer layer and the dopant.

20. The donor substrate as claimed in claim 7, wherein the transfer layer is at least three times thicker than each of the first and second buffer layers.

* * * * *